US012719093B2

(12) United States Patent
Woll et al.

(10) Patent No.: US 12,719,093 B2
(45) Date of Patent: Aug. 25, 2026

(54) METHOD FOR OPERATING AN ELECTROCHEMICAL ENERGY STORAGE SYSTEM WITH A PLURALITY OF ELECTROCHEMICAL ENERGY STORES

(71) Applicant: Robert Bosch GmbH, Stuttgart (DE)

(72) Inventors: Christoph Woll, Gerlingen (DE); Gunther Handte, Unterensingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 558 days.

(21) Appl. No.: 18/453,701

(22) Filed: Aug. 22, 2023

(65) Prior Publication Data

US 2024/0077542 A1 Mar. 7, 2024

(30) Foreign Application Priority Data

Sep. 2, 2022 (DE) ..................... 10 2022 209 130.2

(51) Int. Cl.

| | |
|---|---|
| ***H01M 10/42*** | (2006.01) |
| ***B60L 58/18*** | (2019.01) |
| ***G01R 31/3835*** | (2019.01) |
| ***H01M 10/48*** | (2006.01) |

(52) U.S. Cl.

CPC .......... *H01M 10/425* (2013.01); *B60L 58/18* (2019.02); *G01R 31/3835* (2019.01); *H01M 10/482* (2013.01); *B60L 2210/10* (2013.01); *H01M 2010/4271* (2013.01); *H01M 2220/10* (2013.01); *H01M 2220/20* (2013.01); *H01M 2220/30* (2013.01)

(58) Field of Classification Search

None

See application file for complete search history.

(56) References Cited

U.S. PATENT DOCUMENTS

| | | | | |
|---|---|---|---|---|
| 5,898,291 | A * | 4/1999 | Hall | H02J 7/52 320/120 |
| 2010/0305792 | A1 | 12/2010 | Wilk et al. | |
| 2019/0013681 | A1 | 1/2019 | De Breucker et al. | |
| 2019/0089178 | A1 | 3/2019 | Jeon et al. | |
| 2019/0106011 | A1 | 4/2019 | Zacher et al. | |
| 2021/0028503 | A1* | 1/2021 | Hilligoss | H01M 10/425 |

FOREIGN PATENT DOCUMENTS

| | | | |
|---|---|---|---|
| DE | 102014010183 | A1 | 11/2015 |
| DE | 102020214760 | A1 | 5/2022 |
| EP | 0609101 | B1 | 6/2002 |

OTHER PUBLICATIONS

Yeoh et al.; "Active Cell Balancing with DC/DC Converter for Electric Vehicle"; 2022 10th International Conference on Smart Grid and Clean Energy Technologies; pp. 39-45 (Year: 2022).*

* cited by examiner

*Primary Examiner* — Gregg Cantelmo

(74) *Attorney, Agent, or Firm* — NORTON ROSE FULBRIGHT US LLP

(57) ABSTRACT

A method for operating an electrochemical energy storage system with a plurality of electrochemical energy stores.

6 Claims, 2 Drawing Sheets

METHOD FOR OPERATING AN ELECTROCHEMICAL ENERGY STORAGE SYSTEM WITH A PLURALITY OF ELECTROCHEMICAL ENERGY STORES

CROSS REFERENCE

The present application claims the benefit under 35 U.S.C. § 119 of German Patent Application No. DE 10 2022 209 130.2 filed on Sep. 2, 2022, which is expressly incorporated herein by reference in its entirety.

FIELD

The present invention relates to a method of operating an electrochemical energy storage system with a plurality of electrochemical energy stores, an electrochemical energy storage system, a computer program, and a use of a method of operating an electrochemical energy storage system.

BACKGROUND INFORMATION

In electrically driven vehicles (EV), their availability can be increased by a fail-safe powertrain, so that in the event of a component defect, road traffic is not hindered and incapacitated vehicles on the road are avoided.

This aspect is all the more important in automatically-driven electric vehicles, which are coming onto the market more and more in the future. Since such vehicles are still relatively infrequent on the road today, there are currently no concepts on how to deal with powertrain faults.

At the present time, failure of an energy storage module or energy storage cell means that power is no longer available to the electrical machine, and the electrically-driven vehicle can no longer be moved.

The same applies similarly to mobile, electrically-driven work machines that can no longer independently leave mostly impassable terrain if a battery module fails.

U.S. Patent Application Publication No. US 2019/0106011 A1 describes a power system for interconnecting at least two battery banks.

U.S. Patent Application Publication No. US 2019/0013681 A1 describes an energy storage device with multiple connection strings and with multiple DC/DC converters.

German Patent Application No. DE 10 2014 010 183 A1 describes a power supply device for an automobile, the device being particularly fault-tolerant, and in the event of a fault an emergency supply voltage is provided which is less than the normal supply voltage.

German Patent Application No. DE 10 2020 214 760 describes the design of, and a method for operating, a fault-tolerant battery consisting multiple strings connected in parallel.

European Patent Application NO. EP 609 101 B1 describes an electrical power supply device equipped with a plurality of secondary batteries that are connected in series and/or in parallel.

U.S. Patent Application No. US 2019/013681 A1 describes a system for reconfiguring a rechargeable energy store in two or more connection strings, wherein the rechargeable energy storage device comprises multiple energy storage modules.

U.S. Patent Application No. US 2019/106011 A1 describes a method for autonomously interconnecting at least two battery banks in a drive system of a motor vehicle in which the drive system comprises at least one electric motor, at least two battery banks, at least one traction network that can be supplied by a battery bank and at least one DC-DC converter that can be connected to at least one battery bank.

Reliability can be increased by redundancy of the corresponding component. However, this is connected to disadvantages which are reflected in higher costs and a larger design space. This is particularly true for the most expensive and largest component of the powertrain, the high-voltage battery. Today's batteries for voltages in the range of 400V and higher consist of 100 to 200 and more serially connected battery cells, depending on the voltage. These are combined into battery modules that yield a voltage of less than or equal to 60V.

To achieve the required battery energy content, multiple cells are connected in parallel with one another in the module. These single-string systems have the disadvantage that in the event of a defect of one cell or of one module, the battery will fail completely and thus no more power is available to move the vehicle.

Coupling devices for bypassing cells or modules can be a remedy. In batteries having such coupling devices for switching off individual cells or modules, the defective cell or the defective module can be bypassed; the battery thereby has a lower battery output voltage.

This causes the field-weakening operating mode of the downstream electrical machine to begin earlier (at a lower speed) and thus reduces the power output. However, depending on the state of charge (SoC), the battery is no longer able to provide sufficient power—at reduced voltage.

It is the object of the present invention to further improve the related art. This object is achieved by feature of the present invention.

SUMMARY

The procedure according to an example embodiment of the present invention may have an advantage that the method for operating an electrochemical energy storage system comprises the following steps:

a) ascertaining actual state variables of the electrochemical energy store representing an instantaneous state of the electrochemical energy store;

b) comparing the actual state variables with target state variables representing a target state of the electrochemical energy store;

c) bypassing electrochemical energy stores depending on the comparison;

d) connecting a main switch arranged between the electrochemical energy stores and a DC-DC converter, thereby electrically connecting the electrochemical energy stores to an input of the DC-DC converter;

e) ascertaining an actual mean value variable representing an instantaneous mean value of an electrical voltage of the non-bypassed electrochemical energy storage means;

f) ascertaining an actual voltage variable representing an instantaneous electrical voltage of the electrochemical energy storage system;

g) determining a target voltage variable for the DC-DC converter, representing a target value for an electrical voltage of an output of the DC-DC converter as the sum of the actual mean value variable and actual voltage variable;

This advantageously allows an electrochemical energy storage system to be operated with unaltered output voltage in the event of a failure of an electrochemical energy store, up to the point of an operationally-related decrease in the state of charge of the electrochemical energy stores.

Advantageously, no switch-on or switch-off conditions due to equalizing currents between the electrochemical energy stores need to be observed.

Also advantageously, multiple faults can be detected as well in an electrochemical energy storage system, and the electrochemical energy storage system can continue to operate.

Further advantageous embodiments of the present invention are disclosed herein.

The method according to an example embodiment of the present invention further comprises the following steps:

h) controlling the DC-DC converter with the target voltage variable;

Using a variable target value feedback control method the "missing" electrical voltage resulting from the bypassed electrochemical energy store is exactly equalized by the DC-DC converter.

The method according to an example embodiment of the present invention further comprises the following step:

i) providing, to terminal pins of the electrochemical energy storage system, a voltage variable representing an electrical voltage of the non-bypassed electrochemical energy stores which was increased by the DC-DC converter.

The DC-DC converter adjusts the electrical voltage of the bypassed electrochemical energy store to the original electrical output voltage of the electrochemical energy storage system, whereby advantageously no power reduction takes place, and, for example, incapacitation of an electrically driven vehicle is prevented, whereby the mobility and availability continue to be present.

Advantageously, the method according to the present invention is independent of the mode of operation of the electrochemical energy storage system, for example discharge mode, charging mode or recuperation mode.

An electrochemical energy storage system according to an example embodiment of the present invention comprises

- a plurality of electrochemical energy stores;
- a plurality of sensors, in particular for detecting an electrical voltage of the electrochemical energy stores and/or of the electrochemical energy storage system;
- at least one switch per electrochemical energy store for electrically bypassing the electrochemical energy store;
- a DC-DC converter for converting voltage levels;
- at least one main contactor for electrically connecting the electrochemical energy stores or the DC-DC converter to terminal pins of the electrochemical energy storage system;
- a main switch for electrically connecting at least one of the electrochemical energy stores or the DC-DC converter to the main contactor;
- and at least one means, in particular an electronic battery management controller, configured to perform the steps of the method according to the present invention.

Advantageously, no redundant electrochemical energy stores are required, thereby enabling a cost- and space-optimized design.

According to an advantageous configuration of the present invention, a computer program is provided, comprising commands that cause the electrochemical energy storage system to carry out the method steps according to the present invention.

Furthermore, a machine-readable storage medium is provided, the computer program being stored thereon.

An electrochemical energy storage system according to the present invention finds advantageous use for electric vehicles, fuel cell vehicles, hybrid vehicles, plug-in hybrid vehicles, aircraft, pedelecs or E-bikes, for portable telecommunications or data processing equipment, for electric handheld tools, and in stationary stores for storing in particular regeneratively obtained electrical energy.

BRIEF DESCRIPTION OF THE DRAWINGS

Embodiment examples of the present invention are shown in the figures and explained in further detail in the following description.

DETAILED DESCRIPTION OF EXAMPLE EMBODIMENTS

In all of the figures, identical reference numbers denote identical device components.

Figure 1:
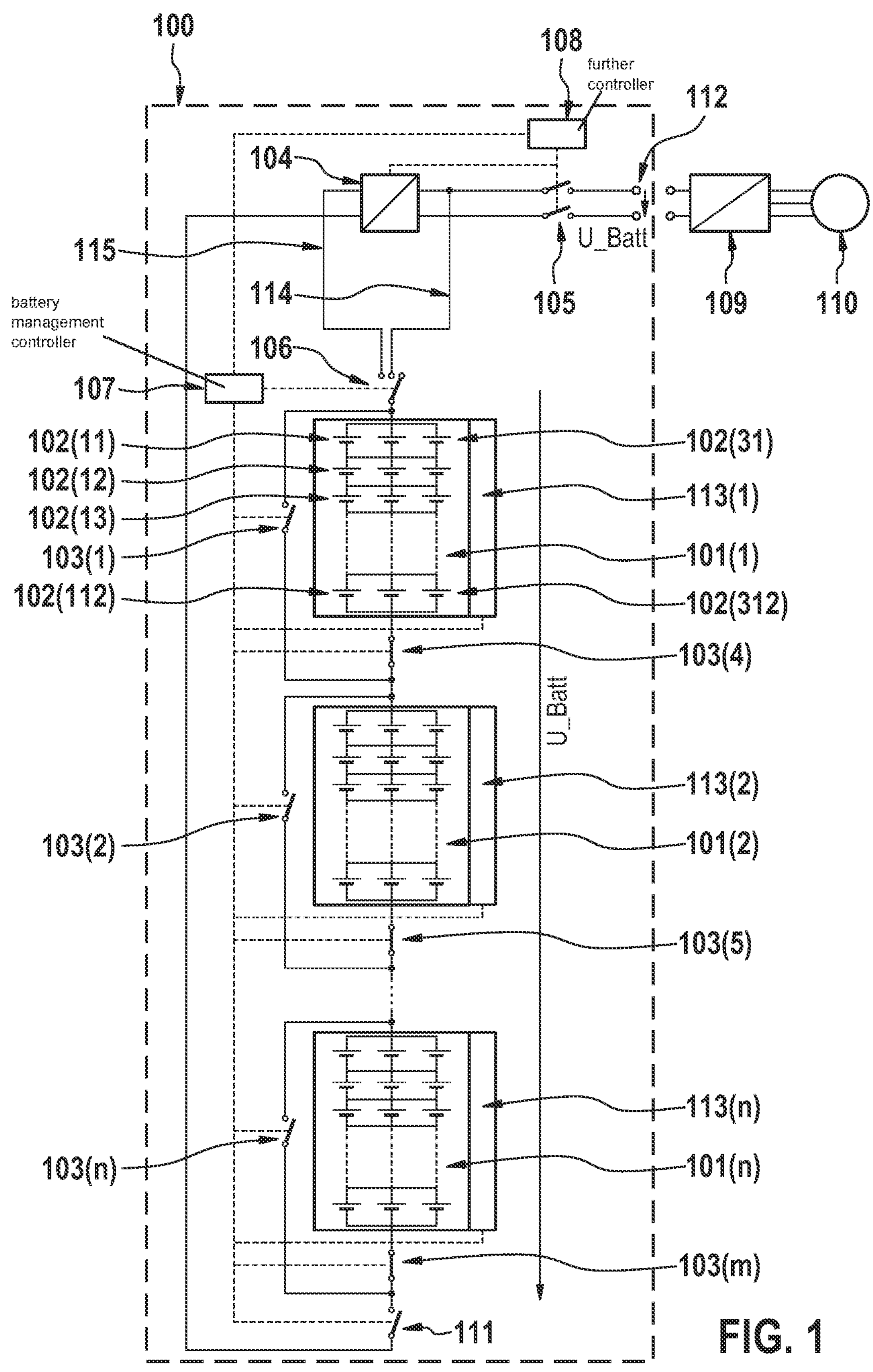
FIG. 1 shows a schematic illustration of an example embodiment of an electrochemical energy storage system according to the present invention.

FIG. 1 shows a schematic illustration of an embodiment of an electrochemical energy storage system 100 according to the present invention. The electrochemical energy storage system 100 comprises a plurality of electrochemical energy stores 101(1), 101(2), **101(*n*) that can be electrically connected in series and/or in parallel using switches 103(1), 103(2), 103 (*n*), 103(4), 103(5), 103(*m*)**.

The electrochemical energy stores 101(1), 101(2), **101(*n*) comprise a plurality of electrochemical cells 102(11), 102(12), 102(13), 102(112), 102(31), 102(312)** connected in series and/or in parallel.

Operational variables, for example the electrical voltage, electrical current and/or temperature of the electrochemical energy stores 101(1), 101(2), **101(*n*) can be detected using electronic monitoring units 113(1), 113(2), 113(*n*). To this end, the electronic monitoring units 113(1), 113(2), 113(*n*)** include, for example, voltage, current, and/or temperature sensors.

Using a main switch 106, the electrochemical energy stores 101(1), 101(2), **101(*n*) can be electrically connected to a main contactor 105 via an electrical connection 114 or to a DC-DC converter 104 via an electrical connection 115**.

The DC-DC converter 104 only goes into operation in the event of a fault, and its purpose is to adjust the voltage of a defective electrochemical energy store that is bypassed by means of one of the switches 103(1), 103(2), **103(*n*) to the original output voltage of the electrochemical energy storage system 100. This provides a maximum possible electrical voltage, by which premature field weakening of an electric machine 110** is prevented.

In a further advantageous embodiment example, further switches can also be provided inside the electrochemical energy stores 101(1), 101(2), **101(*n*)** for bypassing electrochemical energy storage cells.

An advantage in the electrochemical energy storage system 100 according to the present invention is that multiple faults in different electrochemical energy stores 101(1), 101(2), **101(*n*), so-called double faults or multiple faults, can also be dealt with. This provides a simple and particularly robust electrochemical energy storage system 100** independent of an overall electrical voltage, for example 380V to 1000V, of the electrochemical energy storage system 100.

As soon as a first defect in an electrochemical energy store 101(1), 101(2), 101(*n*) occurs, an electrical voltage is applied to an input of the DC-DC converter 104. Any further faults have no effect on the circuitry; only the voltage level at the input of the DC-DC converter 104 is reduced.

Advantageously, therefore, in the event of a fault, there is no voltage reduction at the input of the electric machine 110, so a vehicle with the electrochemical energy storage system 100 can continue to be moved with no loss in performance.

The main contactor 105 is electrically connected to terminal pins 112 of the electrochemical energy storage system 100. An inverter 109 and the electric machine 110 are electrically connected to the electrochemical energy storage system 100 via the terminal pins 112.

A battery management controller 107 controls the switches 103(1), 103(2), 103(*n*), 103(4), 103(5), 103(*m*), a main switch 106, and a switch 111 using a wired and/or wireless connection. Also, a further controller 108, for example a second battery management controller or a vehicle control unit (VCU), is provided which is wired and/or wirelessly connected to the battery management controller 107, the DC-DC converter 104, and the main contactor 105.

Figure 2:
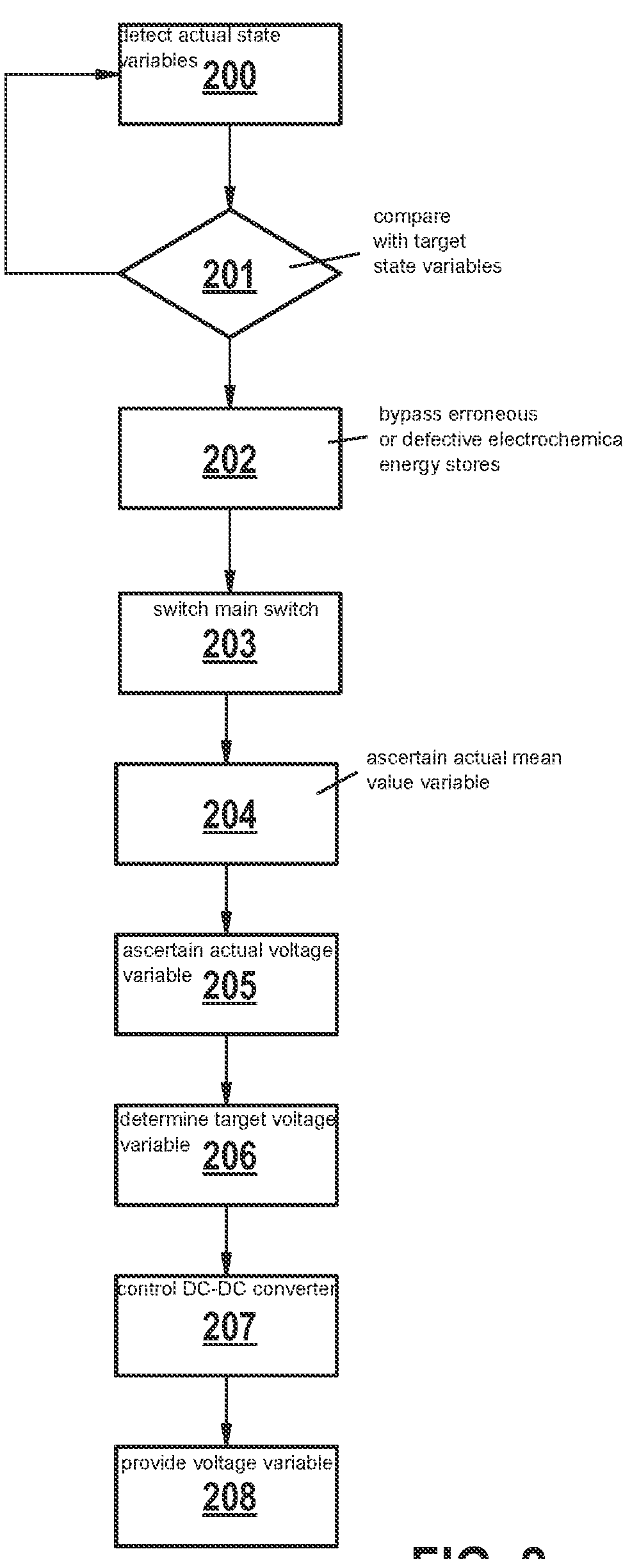
FIG. 2 shows a schematic illustration of a flowchart of an example embodiment of a method according to the present invention for operating an electrochemical energy storage system.

FIG. 2 shows a schematic illustration of a block diagram of an embodiment of a method according to the present invention for operating an electrochemical energy storage system.

In method step 200, actual state variables of the electrochemical energy stores 101(1), 101(2), 101(*n*) are detected, which represent an instantaneous state of the electrochemical energy stores 101(1), 101(2), 101(*n*).

In method step 201, the detected actual state variables are compared with target state variables which represent a target state of the electrochemical energy stores 101(1), 101(2), 101(*n*).

If, for example, the comparison shows a fault or a defect in one or more of the electrochemical energy stores 101(1), 101(2), 101(*n*), then erroneous or defective electrochemical energy stores are bypassed in method step 202 depending on the comparison. For this purpose, the respective switches 103(1), 103(2), 103(*n*) are actuated by the battery management controller 107 and the corresponding electrochemical energy store 101(1), 101(2), 101(*n*) is bypassed.

In method step 203, a main switch 106, which is arranged between the electrochemical energy stores (101(1), 101(2), 101(*n*) and the DC-DC converter 104, is switched, by which the non-bypassed, i.e., operable, electrochemical energy stores 101(1), 101(2), 101(*n*) are electrically connected to an input of the DC-DC converter 104.

Method step 203 is performed directly after method step 202 or simultaneously with method step 202.

Since a state of charge of the electrochemical energy stores 101(1), 101(2), 101(*n*) decreases in the course of operation, the DC-DC converter 104 should not equalize the voltage decrease in the active electrochemical energy stores 101(1), 101(2), 101(*n*) associated with the decrease in the state of charge; rather, it should only equalize a voltage difference, starting from the current voltage levels of the respective electrochemical energy stores 101(1), 101(2), 101(*n*), resulting from the failed and bypassed electrochemical energy stores 101(1), 101(2), 101(*n*).

This is necessary on the one hand to avoid an abrupt increase in the electrical voltage of the electrochemical energy storage system 100 and on the other hand to avoid altering the electrical voltage profile beginning with the time of failure, since other battery management system (BMS) functions, such as a diagnosis of the intact electrochemical energy stores 101(1), 101(2), 101(*n*) or the determination of aging (State of Health, SoH), are based on this profile.

Therefore, an actual mean value variable, which represents an instantaneous mean value of an electrical voltage of the non-bypassed electrochemical energy stores, is ascertained from the individual electrical voltages of the active, non-bypassed electrochemical energy stores 101(1), 101(2), 101(*n*) in method step 204.

In method step 205, an actual voltage variable is ascertained, which represents an instantaneous electrical voltage of the electrochemical energy storage system 100.

In method step 206, a target voltage variable for the DC-DC converter 104 is determined, which represents a target value for an electrical voltage of an output of the DC-DC converter 104 as the sum of the actual mean value variable and the actual voltage variable.

Since the electrical voltage is constantly changing, the mean value is also constantly recalculated. This method involves feedback control with a variable target value setpoint ascertained by the controller 108, the setpoint accordingly controlling the DC-DC converter 104 in method step 207 with the target voltage variable.

In method step 208, a voltage variable is provided at the terminal pins 112 of the electrochemical energy storage system 100, which represents an electrical voltage of the non-bypassed electrochemical energy stores 101(1), 101(2), 101(*n*) which was increased by the DC-DC converter 104.

What is claimed is:

1. A method for operating an electrochemical energy storage system with a plurality of electrochemical energy stores, comprising the following steps:

a) ascertaining actual state variables of the electrochemical energy stores which represent an instantaneous state of the electrochemical energy stores;

b) comparing the actual state variables with target state variables which represent a target state of the electrochemical energy stores;

c) bypassing at least one of the electrochemical energy stores, depending on the comparison;

d) connecting a main switch disposed between the electrochemical energy stores and a DC-DC converter, by which the electrochemical energy stores are electrically connected to an input of the DC-DC converter;

e) ascertaining an actual mean value variable, which represents an instantaneous mean value of an electrical voltage of the non-bypassed electrochemical energy stores;

f) ascertaining an actual voltage variable, which represents an instantaneous electrical voltage of the electrochemical energy storage system;

g) determining a target voltage variable for the DC-DC converter, which represents a target value for an electrical voltage of an output of the DC-DC converter as a sum of the actual mean value variable and the actual voltage variable.

2. The method for operating an electrochemical energy storage system according to claim 1, further comprising the following step:

h) controlling the DC-DC converter with the target voltage variable.

3. The method for operating an electrochemical energy storage system according to claim 1, further comprising the following step:

i) providing, to terminal pins of the electrochemical energy storage system, a voltage variable, which represents an electrical voltage of the non-bypassed electrochemical energy stores which was increased by the DC-DC converter.

4. An electrochemical energy storage system, comprising:

a plurality of electrochemical energy stores;

a plurality of sensors configured to detect an electrical voltage of the electrochemical energy stores and/or of the electrochemical energy storage system;

at least one switch per each electrochemical energy store of the electrical energy stores configured to electrically bypass the electrochemical energy store;

a DC-DC converter configured to convert voltage levels;

at least one main contactor configured to electrically connect the electrochemical energy stores or the DC-DC converter to terminal pins of the electrochemical energy storage system;

a main switch configured to electrically connect at least one of the electrochemical energy stores or the DC-DC converter to the main contactor; and an electronic battery management controller configured to:

a) ascertain actual state variables of the electrochemical energy stores which represent an instantaneous state of the electrochemical energy stores, b) compare the actual state variables with target state variables which represent a target state of the electrochemical energy stores, c) bypass at least one of the electrochemical energy stores, depending on the comparison, d) connect the main switch disposed between the electrochemical energy stores and the DC-DC converter, by which the electrochemical energy stores are electrically connected to an input of the DC-DC converter, e) ascertain an actual mean value variable, which represents an instantaneous mean value of an electrical voltage of the non-bypassed electrochemical energy stores, f) ascertain an actual voltage variable, which represents an instantaneous electrical voltage of the electrochemical energy storage system, g) determine a target voltage variable for the DC-DC converter, which represents a target value for an electrical voltage of an output of the DC-DC converter as a sum of the actual mean value variable and the actual voltage variable.

5. The electrochemical energy storage system according to claim 4, wherein the electrochemical energy stored system is used in an electric vehicle, or a fuel cell vehicle, or a hybrid vehicle, or a plug-in hybrid vehicle, or an aircraft, or a pedelec or E-bike, or a portable device for telecommunications or data processing, or an electric hand-held tool, or a stationary stores for storing regeneratively obtained electrical energy.

6. A non-transitory machine-readable storage medium on which is stored a computer program for operating an electrochemical energy storage system with a plurality of electrochemical energy stores, the computer program, when executed by a computer, causing the computer to perform the following steps:

a) ascertaining actual state variables of the electrochemical energy stores which represent an instantaneous state of the electrochemical energy stores;

b) comparing the actual state variables with target state variables which represent a target state of the electrochemical energy stores;

c) bypassing at least one of the electrochemical energy stores, depending on the comparison;

d) connecting a main switch disposed between the electrochemical energy stores and a DC-DC converter, by which the electrochemical energy stores are electrically connected to an input of the DC-DC converter;

e) ascertaining an actual mean value variable, which represents an instantaneous mean value of an electrical voltage of the non-bypassed electrochemical energy stores;

f) ascertaining an actual voltage variable, which represents an instantaneous electrical voltage of the electrochemical energy storage system;

g) determining a target voltage variable for the DC-DC converter, which represents a target value for an electrical voltage of an output of the DC-DC converter as a sum of the actual mean value variable and the actual voltage variable.

* * * * *